United States Patent
Liu et al.

(10) Patent No.: US 9,916,975 B2
(45) Date of Patent: Mar. 13, 2018

(54) PRECURSORS OF MANGANESE AND MANGANESE-BASED COMPOUNDS FOR COPPER DIFFUSION BARRIER LAYERS AND METHODS OF USE

(71) Applicant: Applied Materials, Inc., Santa Clara, CA (US)

(72) Inventors: Feng Q. Liu, San Jose, CA (US); Ben-Li Sheu, Sunnyvale, CA (US); David Knapp, Santa Clara, CA (US); David Thompson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 104 days.

(21) Appl. No.: 14/919,149

(22) Filed: Oct. 21, 2015

(65) Prior Publication Data

US 2016/0181150 A1     Jun. 23, 2016

Related U.S. Application Data

(60) Provisional application No. 62/095,056, filed on Dec. 21, 2014.

(51) Int. Cl.
| | |
|---|---|
| H01L 21/4763 | (2006.01) |
| H01L 23/48 | (2006.01) |
| H01L 23/52 | (2006.01) |
| H01L 29/40 | (2006.01) |
| C23C 16/00 | (2006.01) |
| H01L 21/02 | (2006.01) |
| C23C 16/18 | (2006.01) |
| H01L 21/285 | (2006.01) |
| H01L 23/532 | (2006.01) |
| H01L 21/768 | (2006.01) |
| C23C 16/34 | (2006.01) |

(52) U.S. Cl.
CPC ........ *H01L 21/02271* (2013.01); *C23C 16/18* (2013.01); *C23C 16/34* (2013.01); *H01L 21/28556* (2013.01); *H01L 21/76843* (2013.01); *H01L 21/76855* (2013.01); *H01L 23/53238* (2013.01); *H01L 21/76873* (2013.01)

(58) Field of Classification Search
CPC ... C23C 16/18; C23C 16/34; H01L 23/53238; H01L 21/02271; H01L 21/28556; H01L 21/76843
USPC ........................ 257/751; 438/653, 643, 627; 427/255.394
See application file for complete search history.

(56) References Cited

U.S. PATENT DOCUMENTS

| | | | | |
|---|---|---|---|---|
| 2013/0292806 A1* | 11/2013 | Ma | ........................... | H01L 29/06 257/632 |
| 2015/0228605 A1* | 8/2015 | Lin | .................. | H01L 21/28556 257/761 |

OTHER PUBLICATIONS

Davis, Luke et al., Synthesis and characterization of transition metal complexes of the sterically demanding 2,2,6,6-tetramethylpiperidide ligand, *Poster University of Illinois at Urbana-Champaign* dated Sep. 4, 2013, 1 page.

(Continued)

*Primary Examiner* — Fernando L Toledo
*Assistant Examiner* — Aaron Gray
(74) *Attorney, Agent, or Firm* — Servilla Whitney LLC

(57) ABSTRACT

Semiconductor devices and methods of making semiconductor devices with a barrier layer comprising manganese nitride are described. Also described are semiconductor devices and methods of making same with a barrier layer comprising Mn(N) and, optionally, an adhesion layer.

20 Claims, 2 Drawing Sheets

(56) References Cited

OTHER PUBLICATIONS

Spicer, Theresa et al., Low-temperature CVD of g-Mn3N22x, *J. Vac. Sci. Technol.* vol. A 31(3) May/Jun. 2013, 6 pages.

\* cited by examiner

PRECURSORS OF MANGANESE AND MANGANESE-BASED COMPOUNDS FOR COPPER DIFFUSION BARRIER LAYERS AND METHODS OF USE

CROSS-REFERENCE TO RELATED APPLICATIONS

This application claims priority to U.S. Provisional Application No. 62/095,056, filed Dec. 21, 2014, the entire disclosure of which is hereby incorporated herein by reference.

FIELD

Embodiments of the present disclosure relate generally to barrier layers in semiconductor devices, and methods of forming such barrier layers. More particularly, embodiments of the disclosure relate to films comprising manganese and/or manganese nitrides ($MnN_x$).

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, interconnects, gates, etc., must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections.

With the continued shrinking of critical dimensions, the need for a single layer barrier/liner for back end of line interconnect is necessary. Traditionally, a deposition of the barrier followed by a liner has been used extensively in the BEOL in the form of TaN/Ta and TaN/Co. However, the use of a multilayer approach is becoming ineffective as the feature sizes of the interconnects are becoming too small to allow for multiple layers. Therefore, there is a need in the art for single layer barrier films using a deposition technique that can conformally coat a high aspect ratio small feature trench or hole.

SUMMARY

One or more embodiments of the disclosure are directed to methods of forming a semiconductor device. A substrate comprising a dielectric layer is provided. The dielectric layer has a feature with at least one sidewall. A manganese nitride barrier layer is formed on the dielectric layer. The barrier layer is formed using one or more of $Mn(t-Bu_2N)_2$ or $Mn(TMP)_2$. A fill layer is deposited over the barrier layer.

Additional embodiments of the disclosure are directed to methods of forming a semiconductor device. A substrate comprising a porous dielectric layer is provided. The dielectric layer has a feature with at least one sidewall. A barrier layer is formed on the porous dielectric layer. The barrier layer is formed by sequentially exposing the substrate to a manganese precursor and ammonia. The manganese precursor comprises one or more of $Mn(t-Bu_2N)_2$ or $Mn(TMP)_2$. A fill layer is deposited over the barrier layer.

Further embodiments of the disclosure are directed to methods of forming a semiconductor device. A substrate comprising a porous or low-k dielectric layer is provided. The dielectric layer has a feature with at least one sidewall. A conformal barrier layer is deposited on the dielectric layer. The barrier layer is formed at a temperature in the range of about 150° C. to about 220° C. by exposing the substrate to a manganese precursor and ammonia. The manganese precursor comprises one or more of $Mn(t-Bu_2N)_2$ or $Mn(TMP)_2$. A fill layer comprising one or more of copper or aluminum is deposited over the barrier layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways As the chip feature size goes below 10 nm, integration of copper interconnect is extremely challenging, especially in the aspects of copper barriers and copper seed deposition. One of these challenges are related to nucleation to achieve dense and conformal film deposition to prevent oxygen and copper passing through. For example, in order to make a good metal-nitride barrier layer, the bonding between metal and nitride should be continuous with minimal defect density at the interface with respect to the low-k and dielectric involved. Manganese nitride and manganese based barriers are good candidates for copper barrier layer to improve integration performance for preventing oxygen and copper migration. First, the manganese can form manganese silicate on the dielectric surface, making a manganese nitride layer with good adhesion on the dielectric layer.

Embodiments of the disclosure are directed to ALD processes with sequential flow of the Mn precursor and ammonia. The inventors have found that $Mn(t-Bu_2N)_2$ and $Mn(TMP)_2$ (TMP=tetramethylpiperidine) form conformal MnN films at low temperature. In some embodiments, the MnN precursor is pulsed into the processing chamber at a predetermined temperature. After purging with argon, the ammonia can be pulsed into the chamber to let ammonia replace the amino ligand of the precursor. The temperature of the chamber can be in the range of about 100° C. to about 250° C. to allow the reaction to occur smoothly. The inventors have found that these new groups of manganese precursors have relatively stable ligands, compared with the TMS ligand (bis(trimethylsilyl)amino) toward surface hydroxyl groups. Therefore, having less potential to generate surface defects for the MnN films to increase the quality of the barrier layer.

Figure 1A:
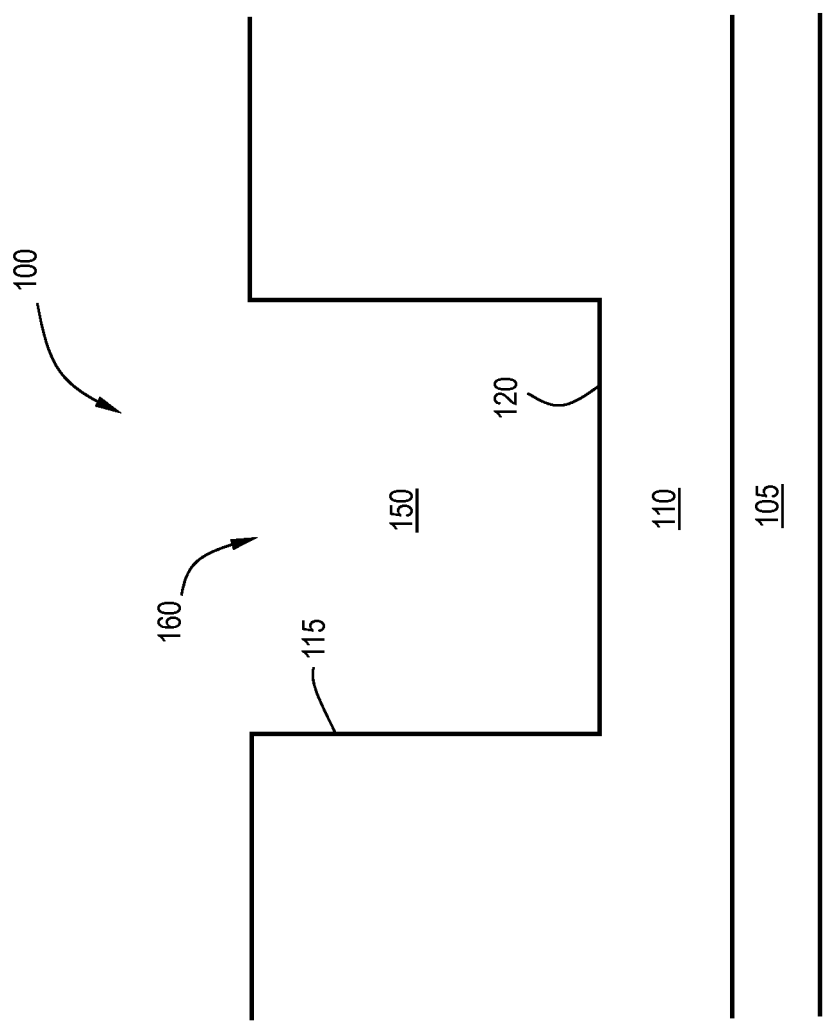
FIGS. 1A and 1B illustrate a dielectric layer before and after deposition of a barrier layer and conductive fill material in accordance with one or more embodiments of the disclosure.

One aspect of the disclosure relates to a microelectronic device comprising a substrate, a dielectric layer, a barrier layer, and a conductive material. FIG. 1A depicts an embodiment of a microelectronic device 100 comprising a substrate 105 and a dielectric layer 110. The dielectric layer 110 is disposed upon the substrate 105, and the dielectric layer 110 has a trench 150 defined by a trench bottom 120, sidewalls 115, and opening 160.

In one or more embodiments, the dielectric layer 110 is a low-k dielectric layer or a porous dielectric. In some embodiments, the dielectric layer comprises $SiO_x$, SiOC, SiONC and combinations thereof. In one or more embodiments, the dielectric layer is a porous low-k dielectric having a dielectric constant less than 3.5.

Figure 1B:
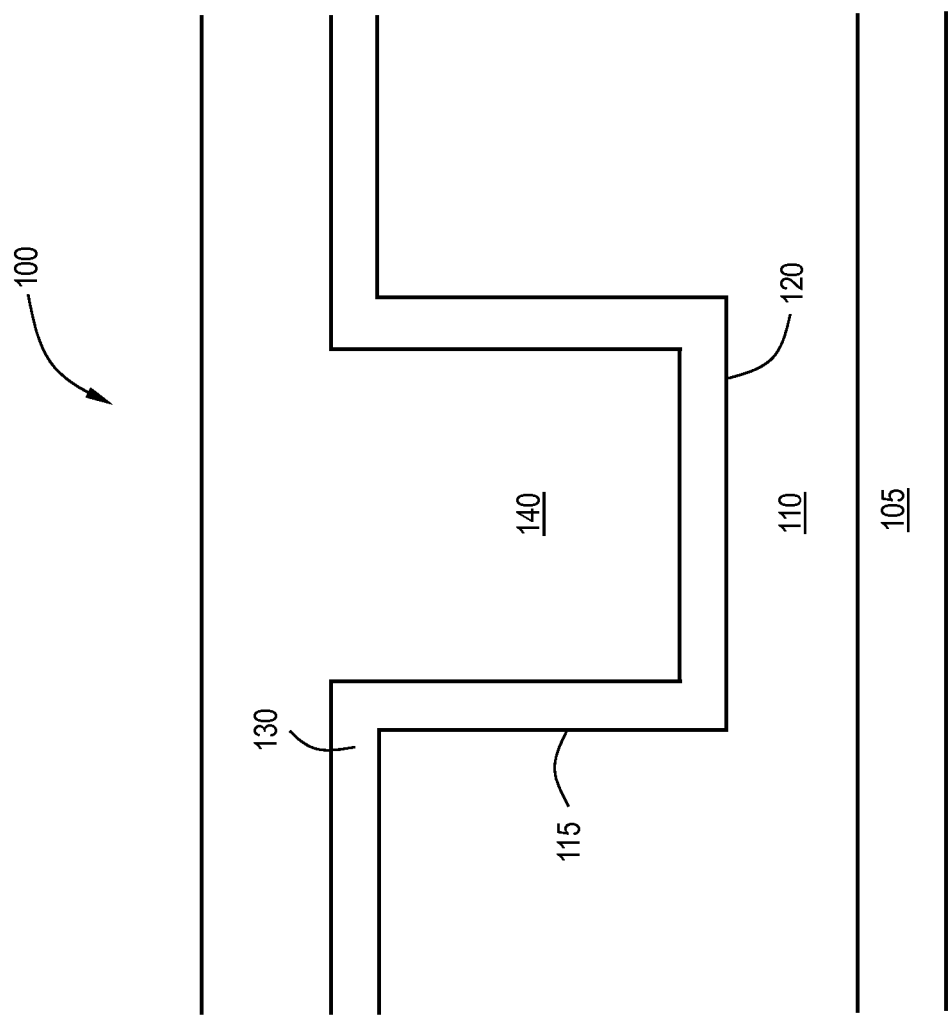

FIG. 1B shows the same microelectronic device 100 after deposition of a barrier layer 130, which covers at least a portion of the sidewall 115 and/or trench bottom 120. As shown in FIG. 1B, the barrier layer 130 may cover the entirety of the sidewall 115 and trench bottom 120.

The barrier layer 130 is disposed on the dielectric layer 110 and comprises manganese nitride. The manganese nitride layers can be deposited by any suitable techniques. For example, the film can be deposited by atomic layer deposition or chemical vapor deposition or a combination of techniques.

In other embodiments, manganese nitrides are deposited in discrete layers by atomic layer deposition. In atomic layer deposition type chambers, the substrate can be exposed to the first and second precursors (also referred to as reactive gases) either spatially or temporally separated processes. Time-domain ALD is a traditional process in which the first precursor flows into the chamber to react with the surface. The first precursor is purged from the chamber before flowing the second precursor (or reactive gas). In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa, to expose the substrate to the first precursor and reactive gas.

In some embodiments, the barrier layer is formed on the dielectric layer using a manganese precursor comprising one or more of $Mn(t-Bu_2N)_2$ or $Mn(TMP)_2$, where TMP is tetramethylpiperidine. The manganese precursor can be reacted with any suitable reactive compound that can form either a manganese, manganese nitride, manganese silicide or combination film. In some embodiments, the manganese precursor is reacted with ammonia either in the gas phase prior to deposition on the substrate or after the manganese precursor has chemisorbed to the substrate surface.

In some embodiments, the manganese precursor is mixed with ammonia prior to exposure to the substrate surface, as in a chemical vapor deposition process. In one or more embodiments, the manganese precursor is exposed to the substrate surface separately from the ammonia reactive gas, as in an atomic layer deposition process. For example, the substrate may be sequentially exposed to the manganese precursor and the ammonia. This sequential exposure can be in a time-domain process or a spatial ALD process.

The barrier layer can be formed at any suitable deposition temperature. The inventors have found that the manganese precursors can be used to form MnN at temperatures less than about 250° C. In some embodiments, the MnN film is formed at a temperature in the range of about 150° C. to about 250° C., or in the range of about 175° C. to about 225° C. In one or more embodiments, the MnN film is formed at a temperature less than about 225° C., 200° C. or 175° C.

The inventors have found that the manganese precursors can form conformal films at temperatures below about 250° C. The conformality of the film is measured as a function of the thickness of the barrier layer relative to the location of the film on the feature. For example, the conformal film is measured as the thickness of the barrier layer at a top of the feature relative to the thickness of the barrier layer at a bottom of the feature. In some embodiments, the barrier layer has a thickness at the top of the feature relative to the thickness at the bottom of the feature in the range of about 0.8:1 to about 1:0.8, or in the range of about 0.9:1 to about 1:0.9.

In some embodiments, the thickness of the barrier layer is less than about 50 Å, or less than about 45 Å, or less than about 40 Å, or less than about 35 Å, or less than about 30 Å, or less than about 25 Å, or less than about 20 Å, or less than about 15 Å. In some embodiments, the thickness of the barrier layer is in the range of about 10 Å to about 25 Å, or in the range of about 10 Å to about 20 Å, or in the range of about 10 Å to about 65 Å.

In some embodiments, a layer of cobalt can be deposited by exposing the substrate to a cobalt precursor followed by a reducing agent and then a layer of manganese can be deposited by exposing the substrate containing the cobalt layer to a manganese precursor followed by a reducing agent (e.g., a nitriding agent). The inventors have found that Mn atoms can diffuse to low K oxides to form Mn(N)SiOx or/and Mn(N)O, of which embedded Mn(N)SiOx/Mn(N)Ox oxides are good oxygen & copper barriers. In one or more embodiments, a layer of manganese can be deposited by exposing the substrate to a manganese precursor followed by a reducing agent (e.g., a nitriding agent) and then a layer of cobalt can be deposited by exposing the substrate containing the manganee layer to a cobalt precursor followed by a reducing agent (e.g., a nitriding agent). The elements in the final film can migrate to the most energetically favorable positions within the layer after deposition. When depositing the layers separately, the cobalt layer can be deposited first or second. In some embodiments, the cobalt layer is the first layer deposited onto the dielectric followed by the manganese layer.

The ratio of cobalt to manganese in the barrier layer can affect the properties of the barrier layer including the wetting properties and barrier properties. The ratio may be adjusted depending on the specific dielectric layer it is being deposited on and/or the specific fill layer being deposited on the barrier layer. In some embodiments, the cobalt to manganese ratio, on an atomic basis, is in the range of about 1:5 to about 5:1, or in the range of about 1:4 to about 4:1, or in the range of about 1:3 to about 3:1, or in the range of about 1:1 to about 3:1 or about 2:1.

In one or more embodiments, the barrier layer comprises 0.1 to 10% dopant, based on the weight of the barrier layer. In some embodiments, the barrier layer comprises 0.2 to 8 wt. % dopant. In particular embodiments, the barrier layer comprises 0.5 to 5 wt. % dopant.

In some embodiments, the barrier layer is substantially free of copper. As used in this specification and the appended claims, the term "substantially free of copper" means that the copper content is less than about 5 wt. %, 4 wt. %, 3 wt. %, 2 wt. % or 1 wt. %. Additionally, copper is not intentionally added to the barrier layer in an amount greater than about 5 wt. %, 4 wt. %, 3 wt. %, 2 wt. % or 1 wt. %. It will be understood by those skilled in the art that a layer that is substantially free of copper may have a copper content that results from copper diffusing from an adjacent layer. Those skilled in the art understand that the copper content might change depending on, for example, oxide types, density, porosity, pore size, etc., and that substantially free of copper means that the copper content is minimized without any copper related leakage issues.

A conductive fill material 140 fills at least a portion of the trench 150 lined with barrier layer 130. According to one or more embodiments, the conductive fill material comprises copper or a copper alloy. In other embodiments, the conductive fill material further comprises Al.

The barrier layer 130 according to some embodiments of the disclosure allows for the direct contact of the fill material 140 without the need for an intervening adhesion layer. However, although the conductive fill material 140 in FIG. 1B is shown in direct contact with the barrier layer 130, intermediate layers may be incorporated in between the conductive fill material 140 and the barrier layer 130, such as adhesion layers or seeding layers to enhance the adhesion properties. According to one or more embodiments, the microelectronic device further comprises an adhesion layer comprising one or more of Ru and Co, Mn. In addition to Ru and/or Co, the adhesion layer may comprise one or more dopants such as Ta, Al, Mg, Cr, Nb, Ti or V.

In some embodiments, a seeding layer is deposited on top of the barrier layer. According to one or more embodiments, the seeding layer comprises an alloy of copper, such as a Cu—Mn alloy. In some embodiments, the seeding layer comprises less than about 5 wt. % Mn, less than about 4 wt. % Mn, less than about 3 wt. % Mn, or less than about 2 wt. % Mn. In one or more embodiments, the seeding layer comprises about 1 wt. % Mn. The line resistance of copper alloys containing 1 wt. % Mn is expected to be the same as or similar to the line resistance of pure copper.

In some embodiments, the barrier layer comprises $MnN_x$. The x of some embodiments is in the range of about 0.1 to about 3, or in the range of about 0.2 to about 2, or in the range of about 0.25 to about 1. In some embodiments, the film comprises manganese silicate and may be formed on the dielectric layer. In one or more embodiments, the manganese film comprises manganese silicate near the dielectric surface and manganese nitride further from the surface. The transition from the silicate to the nitride can be gradual or in discrete steps.

In addition to the films described above, another aspect of the disclosure relates to a method for forming interconnections in a microelectronic device comprising providing a substrate with a dielectric layer disposed thereon, depositing a barrier layer upon the dielectric layer, and depositing a conductive material upon the barrier layer. According to one or more embodiments of this aspect, the barrier layer comprises manganese nitride and a dopant selected from Ta, Al, Mg, Cr, Nb, Ti and V.

The films in accordance with various embodiments of this disclosure can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application.

Substrates may have various dimensions, such as 200 mm or 300 mm diameter wafers, as well as, rectangular or square panes. Substrates on which embodiments of the disclosure may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a manganese-containing film may be formed during plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required. Indeed, other embodiments relate to deposition processes under very mild conditions without a plasma.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments,"

"in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, the method comprising:
    providing a substrate comprising a dielectric layer disposed thereon, the dielectric layer having a feature with at least one sidewall; and
    forming a manganese nitride barrier layer on the dielectric layer, the barrier layer formed using $Mn(TMP)_2$; and
    depositing a fill layer over the barrier layer.

2. The method of claim 1, wherein the barrier layer is formed at a temperature in the range of about 150° C. to about 250° C.

3. The method of claim 1, wherein the barrier layer is formed conformally to the feature.

4. The method of claim 3, wherein the conformally deposited barrier layer has a thickness at a top of the feature relative to a thickness at a bottom of the feature in the range of about 0.8:1 to about 1:0.8.

5. The method of claim 1, wherein the dielectric is a porous dielectric.

6. The method of claim 1, wherein the dielectric is a low-k dielectric.

7. The method of claim 1, wherein the barrier layer is formed by chemical vapor deposition.

8. The method of claim 1, wherein the barrier layer is formed by atomic layer deposition.

9. The method of claim 1, wherein the barrier layer has a thickness of less than about 50 Å.

10. The method of claim 1, wherein the fill layer comprises one or more of copper or aluminum.

11. The method of claim 1, wherein the barrier layer further comprises a dopant.

12. The method of claim 11, wherein the dopant comprises one or more of Ta, Al, Mg, Cr, Nb, Ti or V.

13. The method of claim 1, further comprising forming an adhesion layer on the barrier layer prior to depositing the fill layer.

14. The method of claim 1, further comprising depositing a seeding layer on the barrier layer, the seeding layer comprising an alloy of copper.

15. The method of claim 1, wherein the barrier layer further comprises a dopant selected from the group consisting of Ta, Al, Mg, Cr, Nb, Ti, V and combinations thereof.

16. A method of forming a semiconductor device, the method comprising:
    providing a substrate comprising a porous dielectric layer disposed thereon, the porous dielectric layer having a feature with at least one sidewall; and
    forming a barrier layer on the porous dielectric layer, the barrier layer formed by sequentially exposing the substrate to a manganese precursor and ammonia, the manganese precursor comprising $Mn(TMP)_2$; and
    depositing a fill layer over the barrier layer.

17. The method of claim 16, wherein the barrier layer is formed at a temperature in the range of about 150° C. to about 250° C.

18. The method of claim 16, wherein the barrier layer is formed conformally to the feature.

19. The method of claim 18, wherein the conformally deposited barrier layer has a thickness at a top of the feature relative to a thickness at a bottom of the feature in the range of about 0.8:1 to about 1:0.8.

20. A method of forming a semiconductor device, the method comprising:
    providing a substrate comprising a porous or low-k dielectric layer disposed thereon, the porous dielectric layer having a feature with at least one sidewall; and
    forming a conformal barrier layer on the porous or low-k dielectric layer, the barrier layer formed at a temperature in the range of about 150° C. to about 220° C. by exposing the substrate to a manganese precursor and ammonia, the manganese precursor comprising $Mn(TMP)_2$; and
    depositing a fill layer comprising one or more of copper or aluminum over the barrier layer.

* * * * *